United States Patent
Huang et al.

(10) Patent No.: US 8,379,414 B2
(45) Date of Patent: *Feb. 19, 2013

(54) POWER TRANSISTOR CHIP WITH BUILT-IN ENHANCEMENT MODE METAL OXIDE SEMICONDUCTOR FIELD EFFECT TRANSISTOR AND APPLICATION CIRCUIT THEREOF

(75) Inventors: Chih-Feng Huang, Chupei (TW); Kuang-Ming Chang, Jhongli (TW)

(73) Assignee: Richtek Technology Corp., Chupei ( * ) Notice: Subject to any disclaimer, the term of this patent is extended or adjusted under 35 U.S.C. 154(b) by 457 days.

This patent is subject to a terminal disclaimer.

(21) Appl. No.: 12/701,477

(22) Filed: Feb. 5, 2010

(65) Prior Publication Data
US 2010/0271850 A1 Oct. 28, 2010

(30) Foreign Application Priority Data

Apr. 27, 2009 (TW) .............................. 98113946 A

(51) Int. Cl.
*H02M 3/335* (2006.01)
(52) U.S. Cl. .................... 363/21.15; 363/21.16; 363/49; 363/147
(58) Field of Classification Search ............... 363/21.02, 363/21.12, 21.15, 21.16, 97, 147, 49
See application file for complete search history.

(56) References Cited

U.S. PATENT DOCUMENTS

| | | | | |
|---|---|---|---|---|
| 6,125,046 A | * | 9/2000 | Jang et al. | 363/21.15 |
| 6,781,194 B2 | * | 8/2004 | Baliga | 257/327 |
| 6,807,075 B2 | * | 10/2004 | Miermans | 363/49 |
| 7,129,544 B2 | * | 10/2006 | Hadizad | 257/348 |
| 7,723,972 B1 | * | 5/2010 | Balogh | 323/282 |
| 7,843,017 B2 | * | 11/2010 | Cheng et al. | 257/392 |
| 8,169,803 B2 | * | 5/2012 | Huang et al. | 363/49 |
| 2010/0177542 A1 | * | 7/2010 | Huang | 363/127 |

* cited by examiner

*Primary Examiner* — Rajnikant Patel

(57) ABSTRACT

A power transistor chip with built-in enhancement mode metal oxide semiconductor field effect transistor and application circuit thereof provides an enhancement mode metal oxide semiconductor field effect transistor in association with two series connected resistors to act as a start-up circuit for the AC/DC voltage converter. The start-up circuit can be shut off after the pulse width modulation circuit of the AC/DC voltage converter circuit works normally and still capable of offering a function of brown out detection for the pulse width modulation circuit as well. Besides, the enhancement mode metal oxide semiconductor field effect transistor is built in the power transistor chip without additional masks and processes during the power transistor chip being fabricated such that the entire manufacturing process is simplified substantively with the economical production cost.

15 Claims, 4 Drawing Sheets

POWER TRANSISTOR CHIP WITH BUILT-IN ENHANCEMENT MODE METAL OXIDE SEMICONDUCTOR FIELD EFFECT TRANSISTOR AND APPLICATION CIRCUIT THEREOF

BACKGROUND OF THE INVENTION

1. Field of the Invention

The present invention is related to a voltage regulator circuit and particularly to a power transistor chip with built-in enhancement mode metal oxide semiconductor field effect transistor (enhancement mode MOSFET) and an AC/DC voltage converter using the power transistor chip.

2. Brief Description of the Related Art

Due to the semiconductor technology being developed progressively, the digital products such as the computer and the peripherals thereof are capable of being upgraded continuously. The fast change of the manufacturing process for the semiconductor results in a variety of demands for the power source of the integrated circuit (IC) employed in the computer and the peripherals thereof. Hence, various combinations of voltage regulators using such as the boost converter and the buck converter to meet the need of different power sources of the integrated circuit become one of the most important factors to offer versatile digital products. The AC/DC voltage converter is widely taken as the primary stage circuit of the voltage regulator circuit because it is capable of converting the AC power input to the needed steady direct power output.

Referring to FIG. 1, a circuit diagram of the conventional AC/DC voltage converter is illustrated. The AC/DC voltage converter 10 includes a bridge type rectifying circuit 11, a power transistor chip 12, a pulse width modulation (PWM) circuit 13, a start-up circuit 14, a transformer circuit 15, a filtering and feedback circuit 16 and a working power circuit 17. The pulse width modulation circuit 13 produces the modulated PWM signal to control and output the direct power output $V_o$ according to the magnitude of the feedback voltage of the direct power output $V_o$. However, the pulse width modulation circuit 13 usually is driven by a low voltage direct power and there is no direct power available for operating the pulse width modulation circuit 13 at the time of the AC/DC voltage converter 10 initiating the work thereof. Therefore, it is necessary to use the start-up circuit 14 and the working power circuit 17 to supply the successive power needed by the pulse width modulation circuit 13.

When the AC/DC voltage converter 10 initiates the work thereof, the output end of the bridge type rectifying circuit 11 sends a rippling direct power to enter the pulse width modulation circuit 13 via the resistance in the start-up circuit 14 for operating the pulse width modulation circuit 13. Then, the pulse width modulation circuit 13 performs the normal job thereof afterward according to the magnitude of the feedback voltage of the output direct power $V_o$ and produces the modulated PWM signal such that the time duration of ON and OFF of the power transistor can be controlled for outputting a steady direct power $V_o$. The working power circuit 17, which is connected to the transformer circuit 15, supplies more steady working power for the pulse width modulation circuit 13 performs the job thereof much steadily after the AC/DC voltage converter 10 is started up and outputs the steady direct power $V_o$.

Although the preceding way allows the AC/DC voltage converter to work normally, the start-up circuit 14 keeps in a state of supplying the power to the pulse width modulation circuit 13 unnecessarily. In order to improve the deficiency, the depletion metal oxide semiconductor field effect transistors (Depletion MOSFET) 221, 331 are employed instead to output a start-up signal st via the pulse width modulation circuit 23 or 33 to turn off the operation of the depletion metal oxide semiconductor field effect transistors 221, 331 respectively for conserving the power consumption.

The difference between FIG. 2 and FIG. 3 is in that the depletion metal oxide semiconductor field effect transistors 221, 331 are integrated in the power transistor chip 22 and the pulse width modulation circuit 33 respectively for starting up the AC/DC voltage converter. However, the manufacturing process of the chip becomes more complicated due to the additional process of the channel (N channel or P channel) of the depletion metal oxide semiconductor field effect transistors 221, 331.

Besides, although the preceding different integrations of AC/DC voltage converter circuit such as U.S. Pat. Nos. 6,972, 971, 5,014,178 and 5,285,369 are able to comply with different design needs to integrate the start-up circuit, the pulse width modulation circuit and the power transistor, and etc. into a system chip with single chip circuit or two chip circuits, it is incapable of offering the brown-out detection for the pulse width modulation circuit.

SUMMARY OF THE INVENTION

Accordingly, an object of the present invention is to provide a power transistor chip and an AC/DC voltage converter circuit using the power transistor chip, which utilizes an enhancement mode metal oxide semiconductor field effect transistor (enhancement mode MOSFET) in association with a voltage divider circuit such as two series connected resistors to act as a start-up circuit for the AC/DC voltage converter circuit and the enhancement mode MOSFET is built in the power transistor chip such that not only no additional masks and processes are needed so as to simplify the entire manufacturing process with the economical production cost but also the brown-out detection can be performed as well.

In order to achieve the preceding object, the power transistor chip with an enhancement mode metal oxide semiconductor field effect transistor adaptable to an AC/DC voltage converter circuit according to the present invention comprises a first pin, a second pin, a third pin, a fourth pin, a fifth pin, a power transistor and an enhancement mode metal oxide semiconductor field effect transistor (enhancement mode MOSFET); wherein, the power transistor acts as a power switch of the AC/DC voltage converter circuit and has a first source/drain, a second source/drain and a power transistor gate with the first source/drain coupling with the first pin, the second source/drain coupling with the second pin and the power transistor gate coupling with the third pin; and the enhancement mode MOSFET acts as a start-up circuit of the AC/DC voltage converter circuit, and has a third source/drain, a fourth source/drain and an enhancement mode MOSFET gate with the third source/drain coupling with the first pin, the fourth source/drain coupling with the fourth pin, the enhancement mode MOSFET gate coupling with the fifth pin.

Further, the AC/DC voltage converter circuit according to the present invention is capable of converting the AC power input to the steady DC power output and further comprises a rectifying circuit, a voltage divider circuit, a pulse width modulation circuit, a transformer circuit, a filtering and feedback circuit and a working power circuit in addition to the preceding power transistor chip with the built-in enhancement mode MOSFET.

Wherein, the rectifying circuit is a bridge type rectifying circuit, which has a power input end for receiving the AC power input, and a rectifying output end; the voltage divider circuit includes a first resistor and a second resistor with two ends of the first resistor coupling with the rectifying output end and the enhancement mode MOSFET gate respectively and two ends of the second resistor coupling with the enhancement mode MOSFET gate and the ground of the direct current power output from the bridge type rectifying circuit; the transformer circuit has a primary coil, a secondary coil and an auxiliary coil with the primary coil having an end coupling with the rectifying output end and another end coupling with the first pin of the power transistor chip, i.e., coupling with the first source/drain of the power transistor and the third source/drain of the enhancement mode MOSFET.

The pulse width modulation circuit has a start-up power control end, a working power end, a pulse width modulation signal output end and a current detecting end with the start-up power control end coupling with the fifth pin of the power transistor chip, i.e., the enhancement mode MOSFET gate to control "ON" and "OFF" of the enhancement mode MOSFET and performing the brown out detection via the division voltage offered by the voltage divider circuit, the working power end coupling with the fourth pin of the power transistor chip, i.e., the forth source/drain of the enhancement mode MOSFET to receive a start-up power sent out by the enhancement mode MOSFET, the pulse width modulation signal output end coupling with the third pin of the power transistor chip, i.e., the power transistor gate to output a pulse width modulation signal for modulating the DC power according to the magnitude of a feedback voltage, and the current detecting end coupling with the second pin of the power transistor chip, i.e., the second source/drain of the power transistor, for detecting a current passing through the power transistor.

The working power circuit couples with the auxiliary coil and the working power end of the pulse width modulation circuit to keep supplying the power needed by the pulse width modulation circuit after the start-up power output by the enhancement mode MOSFET being cut off by the pulse width modulation circuit; and the filtering and feedback circuit couple with the secondary coil to filter and output the steady DC power and supply a feedback voltage needed by the pulse width modulation circuit.

In addition, a power transistor chip with enhancement metal oxide semiconductor field effect transistor adaptable to an AC/DC voltage converter circuit according to the present invention further comprises a first type semiconductor base, a first type drain contact zone disposed under the first type a $1^{st}$ second type well disposed on the first type semiconductor base, a $1^{st}$ second type well contact zone disposed on the $1^{st}$ second type well, a $1^{st}$ first type source zone disposed on the $1^{st}$ second type well, which is at a lateral side of the $1^{st}$ second type well contact zone, a $2^{nd}$ second type well disposed on the first type semiconductor base, which is at a lateral side of the $1^{st}$ second type well; a $2^{nd}$ second type well contact zone disposed on the $2^{nd}$ second type well, a $2^{nd}$ first type source zone disposed on the $2^{nd}$ second type well, which is at a lateral side of the $2^{nd}$ second type well contact zone, a $1^{st}$ gate zone disposed on the first type semiconductor base, which is between the $1^{st}$ second type well and said $2^{nd}$ second type well, a $3^{rd}$ second type well disposed on the first type semiconductor base, a $3^{rd}$ second type well contact zone disposed on the $3^{rd}$ second type well, a $3^{rd}$ first type source zone disposed on the $3^{rd}$ second type well, which is at a lateral side of the $3^{rd}$ second type well contact zone, a $4^{th}$ second type well disposed on the first type semiconductor base, which is at a lateral side of the $3^{rd}$ second type well, a $4^{th}$ second type well contact zone disposed on the $4^{th}$ second type well, a $4^{th}$ first type source zone disposed on the $4^{th}$ second type well, which is at a lateral side of the $4^{th}$ second type well contact zone; and a second gate zone disposed on the first type semiconductor base, which is between the $3^{rd}$ second type well and the $4^{th}$ second type well.

In short, a power transistor chip with built-in enhancement mode metal oxide semiconductor field effect transistor and application circuit thereof provides an enhancement mode metal oxide semiconductor field effect transistor in association with a voltage divider circuit such as two series connected resistors to act as a start-up circuit for the AC/DC voltage converter. The start-up circuit can be shut off after the pulse width modulation circuit of the AC/DC voltage converter circuit works normally and still capable of offering a function of brown out detection for the pulse width modulation circuit as well. Besides, the enhancement mode metal oxide semiconductor field effect transistor is built in the power transistor chip without additional masks and processes during the power transistor chip being fabricated such that the entire manufacturing process is simplified substantively with the economical production cost.

BRIEF DESCRIPTION OF THE DRAWINGS

The detailed structure, the applied principle, the function and the effectiveness of the present invention can be more fully understood with reference to the following description and accompanying drawings, in which.

DETAILED DESCRIPTION OF THE INVENTION

Figure 1:
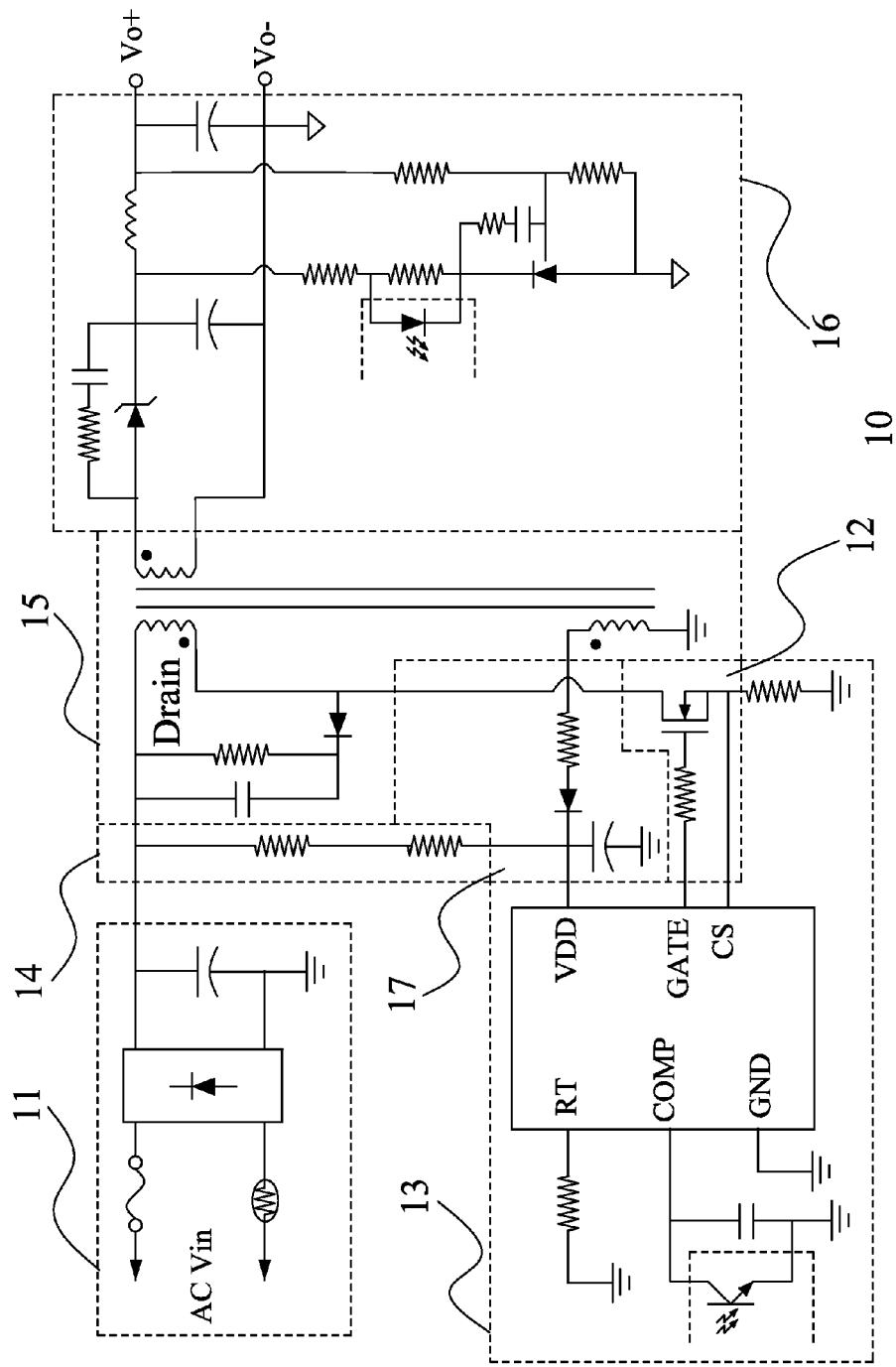
FIG. 1 is a circuit diagram illustrating the conventional AC/DC voltage converter.
Figure 2:
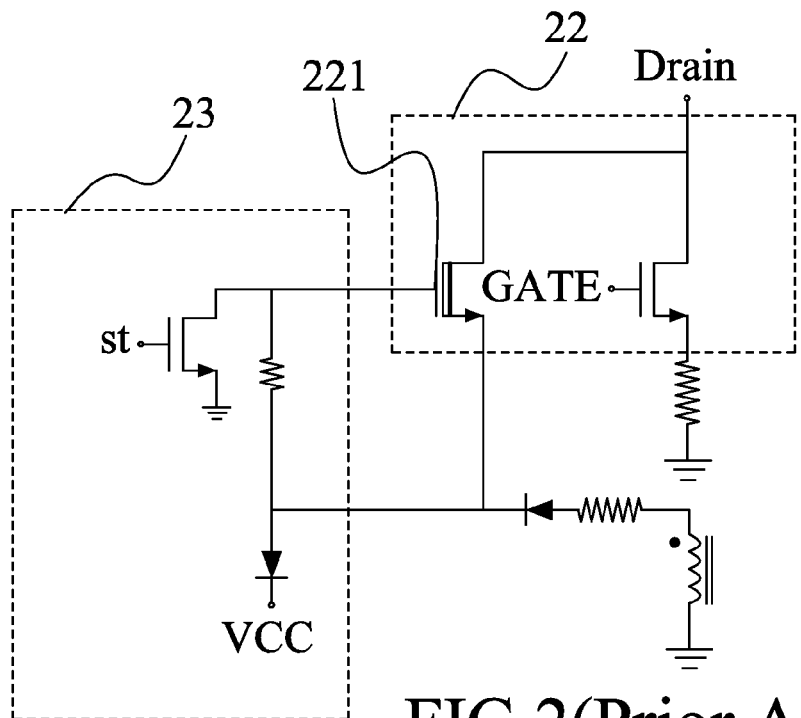
FIG. 2 is a circuit diagram illustrating the conventional AC/DC voltage converter employing the depletion metal oxide semiconductor field effect transistor (Depletion MOSFET) as a start-up circuit.
Figure 3:
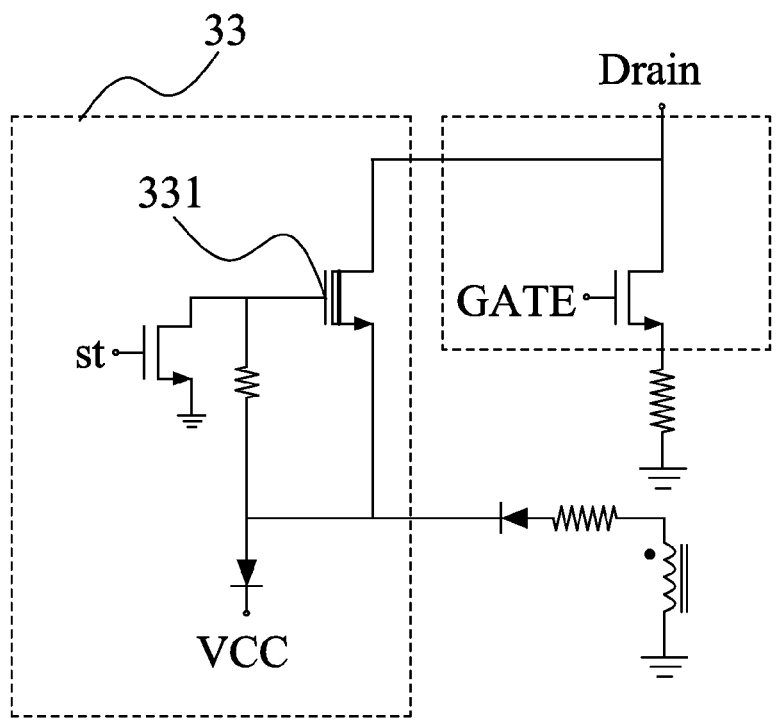
FIG. 3 is a circuit diagram illustrating another conventional AC/DC voltage converter similar to FIG. 2.
Figure 4:
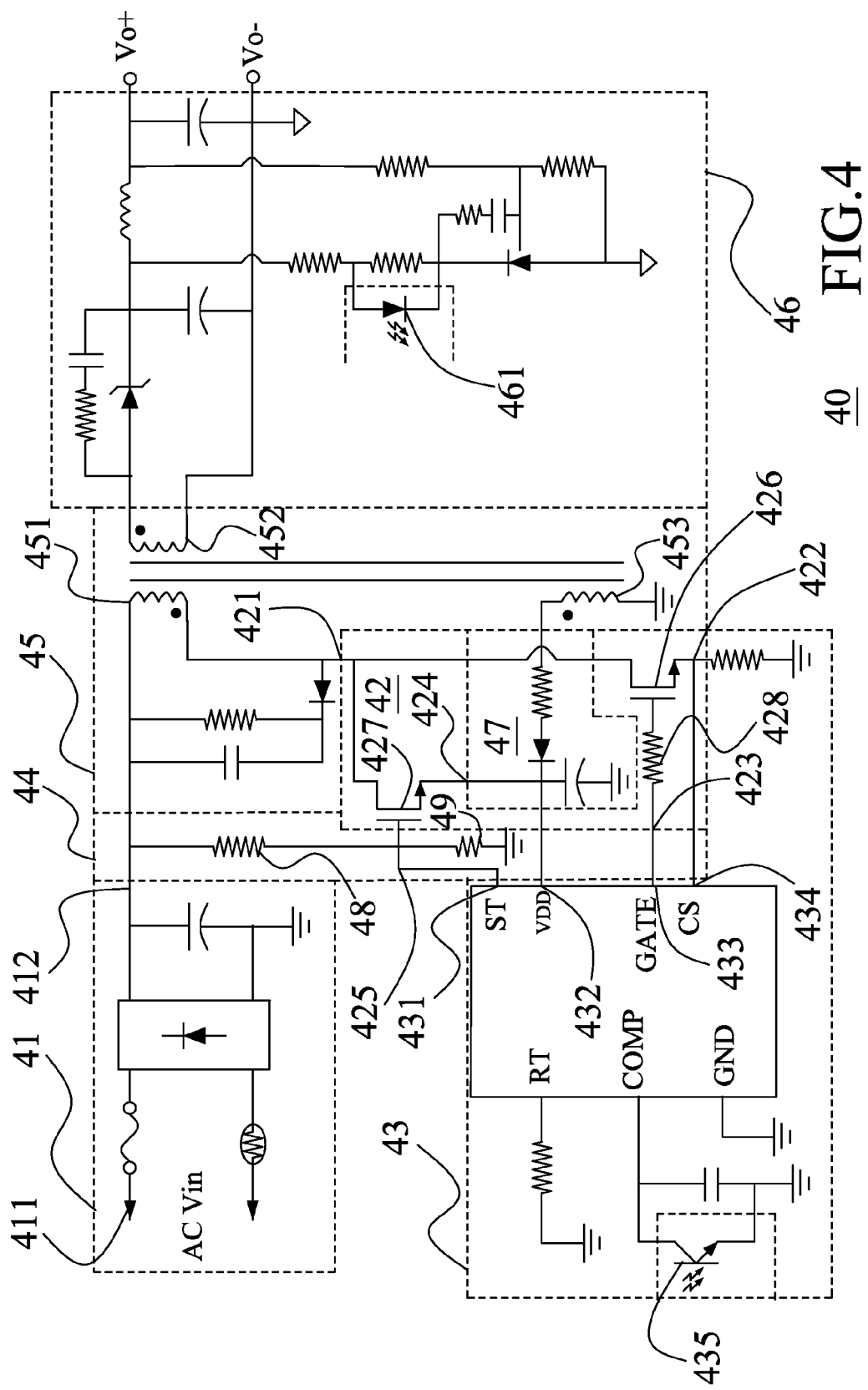
FIG. 4 is a circuit diagram illustrating an AC/DC voltage converter of a preferred embodiment according to the present invention.

Referring to FIG. 4, a preferred embodiment of an AC/DC voltage converter according to the present invention is illustrated. The AC/DC voltage converter circuit 40 is capable of converting the AC input power $V_{in}$ coming from the power end 411 to a steady DC output power $V_o$. The AC/DC voltage converter circuit 40 includes a bridge type rectifying circuit 41, a power transistor chip 42, a pulse width modulation circuit 43, a transformer circuit 45, a filtering and feedback circuit 46, and a working power circuit 47. A voltage divider circuit 44, which is further included in the AC/DC voltage converter circuit 40, has two resistors 48, 49, which are connected to each other in series, to offer the function of voltage division.

The power transistor chip 42 shown in FIG. 4 has a first pin 421, a second pin 422, a third pin 423, a fourth pin 424, a fifth pin 425, a power transistor 426, and an enhancement mode metal oxide semiconductor field effect transistor (enhancement mode MOSFET) 427. Hence, the enhancement mode MOSFET 427, which acts as a start-up circuit of the AC/DC voltage converter circuit 40, is built in the power transistor chip 42 to simplify the manufacturing process of the chip used in the AC/DC voltage converter circuit 40.

Although the power transistor 426 and the enhancement mode MOSFET 427 are exemplified with N-type metal oxide semiconductor field effect transistor and N-type enhancement mode MOSFET, and the gate resistor 428 in the power transistor 426 is built in the power transistor chip 42, persons skilled in the art realize different type transistors such as the P-type MOSFET or P-type enhancement mode MOSFET can be adopted as well. Further, the built-in resistor 428 can be optionally integrated in a chip with the pulse width modulation circuit 43 instead of being included in the power transistor chip 42.

Wherein, the power transistor 426, which is a power switch of the AC/DC voltage converter circuit 40, has the first source/drain coupling with the first pin 421, the second source/drain coupling with the second pin 422 and the power transistor gate coupling with the third pin 423 via the resistor 428. The enhancement mode MOSFET 427 has a third source/drain to couple with the first pin 421, a fourth source/drain to couple with the fourth pin 424, and a gate of the enhancement mode MOSFET 427 to couple with the fifth pin 425.

Besides, the voltage divider circuit 44, which is composed of the two resistors 48, 49, obtains a division voltage from the rectifying output end 412 and supplies the division voltage to the gate of the enhancement mode MOSFET 427. The gate of the enhancement mode MOSFET couples with the series end of the resistors 48, 49. Another end of the resistor 48 couples with the rectifying output end 412 of the bridge type rectifying circuit 41, and another end of the resistor 49 couples with the ground end of the direct current power output by the bridge type rectifying circuit 41.

When the AC/DC voltage converter circuit 40 is initiated to work, the bridge type rectifying circuit 41 receives the AC power input $V_{in}$ from the power source end 411 thereof and rectifies the full wave of the AC power input $V_{in}$ such that a rippling direct current power is output from the bridge type rectifying circuit 41 to the first pin 421 of the power transistor chip, i.e., the third source/drain of the enhancement mode MOSFET 427 and the first source/drain of the power transistor 426, via a main coil 451 of the transformer circuit 45, wherein an end of the main coil 451 is connected to the rectifying output end 412 and another end of the main coil 451 is coupled to the first pin 421 of the power transistor chip 42.

In order to supply the power to operate the pulse width modulation circuit 43, the working power end 432 of the pulse width modulation circuit 43 couples with the fourth pin 424 of the power transistor chip 42, i.e., the fourth source/drain of the enhancement mode MOSFET 427. The start-up power control end 431 of the pulse width modulation circuit 43 is coupled to the fifth pin 425 of the power transistor chip 42, i.e., the gate of the enhancement mode MOSFET. At this time, the start-up power control end 431 of the pulse width modulation circuit 43 is not pulled down to the low reference level such that the enhancement mode MOSFET 427 is driven by the division voltage of the series connected resistors 48, 49 to become a ON state to transmit the ripple direct current power output by the bridge type rectifying circuit 41 to the fourth source/drain of the enhancement mode MOSFET 427.

Thus, the pulse width modulation circuit 43 obtains the power for initiating the work thereof by means of the working power end 432 thereof coupling with the fourth source/drain of the enhancement mode MOSFET 427. In addition, the pulse width modulation circuit 43 produces the modulated PWM signal and sends the PWM signal to the PWM signal output end 433 in accordance with the magnitude of the feedback voltage of the direct current power $V_o$ output by the AC/DC voltage converter circuit 40. Then, the modulated PWM signal is transmitted to the gate of the power transistor of the power transistor chip 42 via the resistor 428 and the third pin 423 of the power transistor chip 42 to control the time durations of "ON" and "OFF" of the power transistor 426. The second pin 422 of the power transistor chip 42 is coupled to the current detecting end 434, which is used to detect the current passing through the power transistor 426, for adjusting the pulse width of the PWM signal and allowing the AC/DC voltage converter circuit 40 being able to output the direct current power $V_o$ steadily.

When the pulse width modulation circuit 43 initiates to work, the secondary coil 452 of the transformer circuit 45 is induced a voltage, and then the voltage is filtered by the filtering and feedback circuit 46, which couples with the secondary coil 452, to output the steady direct current power $V_o$. A reference feedback voltage needed by the pulse width modulation circuit 43 is obtained by means of the isolated detection of a light emitting diode 461 of the filtering and feedback circuit 46 and an optical transistor 435 in the pulse width modulation circuit 43.

In addition, an auxiliary coil 453 of the transformer circuit 45 produces an induced voltage simultaneously to be filtered and transmitted to the working power end 432 by the working power circuit 47, which couples with the auxiliary coil 453. Under this circumstance, the steady working power supplied by the working power circuit 47 has already been able to supply much steadier working power needed by the pulse width modulation circuit 43 such that the pulse width modulation circuit 43 pulls down the potential of the start-up power control end 431 to a level sufficient to turn off the enhancement mode MOSFET 427 and to offer the function of the brown-out detection of the pulse width modulation circuit 43. In this way, the start-up power transmitted by the enhancement mode MOSFET 427 can be shut off through the operation of the enhancement mode MOSFET 427 being turned off. Meanwhile, the brown-out detection can be performed through the lowered division voltage of the series connected resistors 48, 49. Hence, the direct current power Vo sent by the AC/DC voltage converter circuit 40 being unable to reach the required specification even if the pulse width modulation circuit 43 works with full time can be avoided. Afterward, the steady working power can be supplied by the working power circuit 47 to offer the power required by the pulse width modulation circuit 43 for saving the power consumption of the AC/DC voltage converter circuit 40.

Figure 5:
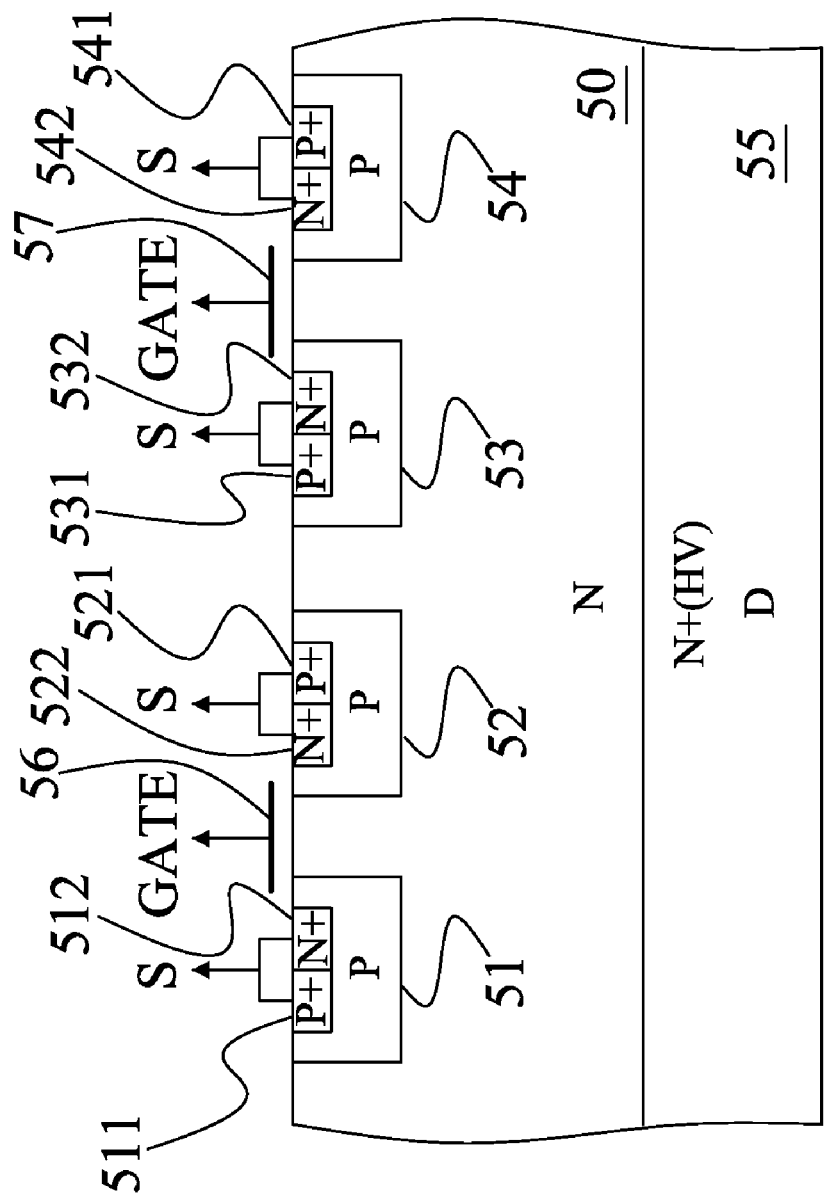
FIG. 5 is a diagram illustrating the structure of the power transistor chip according to the present invention.

Referring to FIG. 5, the power transistor chip with built-in enhancement mode MOSFET according to the preferred embodiment of the present invention provides the N-type semiconductor as the first type semiconductor and the P-type semiconductor as the second type semiconductor to constitute a N-type metal oxide semiconductor field effect transistor. Alternatively, a P-type semiconductor as the first type semiconductor and the N-type semiconductor as the second type semiconductor can be adopted to constitute the power transistor chip formed with the P-type metal oxide semiconductor field effect transistor.

The power transistor chip 42 as shown in FIG. 5 has a first type semiconductor base 50 with a first type drain contact zone 55 being disposed under the first type semiconductor base 50 as a drain of the power transistor 426 and the enhancement mode MOSFET 427. The second type wells 51, 52, 53 and 54 are disposed on the first type semiconductor base 50.

Wherein, the second type well 52 is disposed at the lateral side of the second type well 51, the second type well 54 is disposed at the lateral side of the second type well 53. Each of the second type wells 51, 52, 53, 54 is disposed with a second type well contact zone 511, 521, 531, 541 respectively. The first type source zones 512, 522, 532, 542 is disposed on the second type wells 51, 52, 53, 54 respectively, which are disposed at the lateral sides of the second well contact zone 511, 521, 531, 541 respectively to act as the source of the power transistor 426 or the enhancement mode MOSFET 427. Besides, on the first type semiconductor base 50 between the second type wells 51, 52 is disposed with a gate zone 56, and on the first type semiconductor base 50 between the second type wells 53, 54 is disposed with a gate zone 57. The gate zones 56, 57 each are consisted with multiple crystal silicone conductors for constituting the gate of the power transistor 426 and the enhancement mode MOSFET 427.

It is appreciated that the power transistor chip 42 with built-in enhancement mode metal oxide semiconductor field effect transistor according to the present invention has the enhancement mode MOSFET 427 being built in the power transistor chip 42 and a similar doped structure is provided between the enhancement mode MOSFET 427 and the power transistor 426 such that both the transistors 427, 426 are fabricated with the same manufacturing process without the additional masks and processes. The objects of simplifying the manufacturing process and saving the cost can be achieved substantively. Further, Due to the enhancement mode MOSFET in association with the voltage divider circuit composed of two series connected resistors acting as the start-up circuit, the function of brown-out detection of the pulse width modulation circuit can be performed even if the operation of the enhancement mode MOSFET is cut off after the AC/DC voltage converter circuit works steadily such that response to the voltage $V_{in}$ of the AC power being in a state of insufficiency can be obtained promptly.

While the invention has been described with referencing to the preferred embodiment thereof, it is to be understood that modifications or variations may be easily made without departing from the spirit of this invention, which is defined by the appended claims.

What is claimed is:

1. A power transistor chip, which is adaptable to an AC/DC voltage converter circuit with a transformer circuit, a pulse width modulation (PWM) circuit and a voltage divider, comprising:
   a first pin connecting with the transformer circuit;
   a second pin connecting with the PWM circuit;
   a third pin connecting with the PWM circuit;
   a fourth pin connecting with the PWM circuit;
   a fifth pin connecting with the voltage divider circuit and the PWM circuit respectively;
   a power transistor acting as a switch of said AC/DC voltage converter circuit and having a first source/drain, a second source/drain and a power transistor gate, wherein said first source/drain couples with said first pin, said second source/drain couples with said second pin and said power transistor gate couples with said third pin; and
   an enhancement mode metal oxide semiconductor field effect transistor (enhancement mode MOSFET) acting as a start-up circuit of said AC/DC voltage converter circuit, and having a third source/drain, a fourth source/drain and an enhancement mode MOSFET gate, wherein said third source/drain couples with said first pin, said fourth source/drain couples with said fourth pin, said enhancement mode MOSFET couples with said fifth pin.

2. The power transistor chip as defined in claim 1 further comprises a resistor between said power transistor gate and said third pin.

3. The power transistor chip as defined in claim 1, wherein said power transistor is an N-type metal oxide semiconductor field effect transistor.

4. The power transistor chip as defined in claim 1, wherein said enhancement mode MOSFET is an N-type enhancement mode MOSFET.

5. An AC/DC voltage converter circuit adaptable to convert an AC power to a steady DC power comprising:
   a power transistor acting as a power switch of said AC/DC voltage converter circuit and having a first source/drain, a second source/drain and a power transistor gate;
   an enhancement mode metal oxide semiconductor field effect transistor (enhancement mode MOSFET), which acts as a start-up circuit of said AC/DC voltage converter circuit, having a third source/drain, a fourth source/drain and an enhancement mode MOSFET gate, wherein said third source/drain couples with said first source/drain;
   a rectifying circuit having a power input end and a rectifying output end, wherein said power input end receives said AC power;
   a voltage divider circuit obtaining a division voltage from said rectifying output end to supply to said enhancement mode MOSFET gate;
   a transformer circuit having a primary coil and a secondary coil, wherein said primary coil has an end coupling with said rectifying output end and another end controlled with said power transistor for said DC power source being output via said secondary coil; and
   a pulse width modulation circuit having a start-up power control end, a working power end, and a pulse width modulation signal output end, wherein said pulse width modulation signal output end couples with said power transistor gate to control "ON" and "OFF" of said power transistor, said working power end couples with said fourth source/drain to receive a start-up power transmitted by said enhancement mode MOSFET, said start-up power control end couples with said enhancement mode MOSFET gate and said power transistor gate to shut off said enhancement mode MOSFET after said pulse width modulation circuit is started up.

6. The AC/DC voltage converter circuit as defined in claim 5, wherein said pulse width modulation circuit utilizes the division voltage offered by said voltage divider circuit to detect an insufficient power source.

7. The AC/DC voltage converter circuit as defined in claim 5 further comprises a filtering and feedback circuit to couple with said secondary coil for filtering and output said AC power and offering a feedback voltage for said pulse width modulation circuit outputting a pulse width modulation signal according to magnitude of said feedback to modulate said DC power.

8. The AC/DC voltage converter circuit as defined in claim 5 further comprises a working power circuit and said transformer further comprises an auxiliary coil, wherein said working power circuit couples with said auxiliary coil and said working power end of said transformer circuit for continuing to offer a power needed by said pulse width modulation circuit after said pulse width modulation circuit cutting off said start-up power.

9. The AC/DC voltage converter circuit as defined in claim 5, wherein said power transistor is an N-type metal oxide semiconductor field effect transistor.

10. The AC/DC voltage converter circuit as defined in claim 5, wherein said enhancement mode MOSFET is an N-type enhancement mode MOSFET.

11. The AC/DC voltage converter circuit as defined in claim 5, wherein said power transistor and said enhancement mode MOSFET are integrated in a chip.

12. The AC/DC voltage converter as defined in claim 5 further comprises a resistor between said power transistor gate and said pulse width modulation signal output end to be integrated in the same chip with said power transistor and said enhancement mode MOSFET.

13. A power transistor chip with enhancement metal oxide semiconductor field effect transistor adaptable to an AC/DC voltage converter circuit comprising:
a first type semiconductor base;
a first type drain contact zone being disposed under said first type semiconductor base;
a $1^{st}$ second type well being disposed on said first type semiconductor base;
a $1^{st}$ second type well contact zone being disposed on said first one second type well;
a $1^{st}$ first type source zone being disposed on said $1^{st}$ second type well, which is at a lateral side of said $1^{st}$ second type well contact zone;
a $2^{nd}$ second type well being disposed on said first type semiconductor base, which is at a lateral side of said $1^{st}$ second well;
a $2^{nd}$ second type well contact zone being disposed on said $2^{nd}$ second well;
a $2^{nd}$ first type source zone being disposed on said $2^{nd}$ second well, which is at a lateral side of said $2^{nd}$ second well contact zone;
a $1^{st}$ gate zone being disposed on said first type semiconductor base, which is between said $1^{st}$ second well and said $2^{nd}$ second well;
a $3^{rd}$ second type well being disposed on said first type semiconductor base;
a $3^{rd}$ second well contact zone being disposed on said $3^{rd}$ second well;
a $3^{rd}$ first source zone being disposed on said $3^{rd}$ second well, which is at a lateral side of said $3^{rd}$ second well contact zone;
a $4^{th}$ second well being disposed on said first type semiconductor base, which is at a lateral side of said $3^{rd}$ second well;
a $4^{th}$ second well contact zone being disposed on said $4^{th}$ second well;
a $4^{th}$ first source zone being disposed on said fourth second well, which is at a lateral side of said $4^{th}$ second well contact zone; and
a second gate zone being disposed on said first type semiconductor base, which is between said $3^{rd}$ second well and said $4^{th}$ second well.

14. The AC/DC voltage converter circuit as defined in claim 13, wherein said first type is P-type semiconductor, and said second type is N-type semiconductor.

15. The AC/DC voltage converter circuit as defined in claim 13, wherein said first type is N-type semiconductor, and said second type is P-type semiconductor.

* * * * *